US009208745B2

(12) United States Patent
Son et al.

(10) Patent No.: US 9,208,745 B2
(45) Date of Patent: Dec. 8, 2015

(54) SHIFT REGISTER AND GATE DRIVING CIRCUIT USING THE SAME

(71) Applicant: Hydis Technologies Co., Ltd., Gyeonggi-do (KR)

(72) Inventors: Ki Min Son, Gyeonggi-do (KR); Joon Sung An, Seoul (KR); Won Hee Lee, Gyeonggi-do (KR)

(73) Assignee: Hydis Technologies Co., Ltd., Icheson-si, Gyeonggi-do (KR)

( * ) Notice: Subject to any disclaimer, the term of this patent is extended or adjusted under 35 U.S.C. 154(b) by 262 days.

(21) Appl. No.: 13/716,256

(22) Filed: Dec. 17, 2012

(65) Prior Publication Data

US 2013/0169609 A1    Jul. 4, 2013

(30) Foreign Application Priority Data

Dec. 30, 2011    (KR) ......................... 10-2011-0147295

(51) Int. Cl.
*G09G 5/00* (2006.01)
*G11C 19/28* (2006.01)

(52) U.S. Cl.
CPC ........... *G09G 5/00* (2013.01); *G11C 19/28* (2013.01); *G11C 19/287* (2013.01)

(58) Field of Classification Search
None
See application file for complete search history.

(56) References Cited

U.S. PATENT DOCUMENTS

| 8,344,989 | B2 | 1/2013 | Kim | |
|---|---|---|---|---|
| 8,542,178 | B2 | 9/2013 | Yoo et al. | |
| 2008/0012818 | A1* | 1/2008 | Lee et al. | 345/100 |
| 2009/0256794 | A1* | 10/2009 | Jang et al. | 345/100 |
| 2010/0245300 | A1* | 9/2010 | Chan et al. | 345/204 |
| 2012/0188210 | A1* | 7/2012 | Zhang et al. | 345/204 |

OTHER PUBLICATIONS

Abstract of Korean Patent—KR20070002836 dated Jan. 5, 2007, 1 page.
Abstract of Korean Patent—KR20100070627 dated Jun. 28, 2007, 1 page.

* cited by examiner

*Primary Examiner* — Kathy Wang-Hurst
*Assistant Examiner* — Douglas Wilson
(74) *Attorney, Agent, or Firm* — Dority & Manning, P.A.

(57) ABSTRACT

Disclosed are a shift register, and a gate driving circuit including a plurality of shift registers connected in sequence to respectively supply scan signals to a plurality of gate lines of a display device. Each shift register includes: an input unit which outputs a directional input signal having a gate high or low voltage based on an output signal from a previous or subsequent shift register to a first node; an inverter unit which is connected to the first node, generates an inverting signal to a signal at the first node, and outputs the inverting signal to a second node; and an output unit which includes a pull-up unit connected to the first node and activating an output clock signal based on the signal at the first node, and a pull-down unit activating and outputting a pull-down output signal based on a signal at the second node.

37 Claims, 14 Drawing Sheets (a)     (b)

(a)          (b)          (c)

SHIFT REGISTER AND GATE DRIVING CIRCUIT USING THE SAME

CROSS-REFERENCE TO RELATED APPLICATION

This application claims priority to and the benefit of Korean Patent Application No. 10-2011-0147295 filed in the Korean Intellectual Property Office on Dec. 30, 2011, the entire contents of which are incorporated herein by reference.

BACKGROUND OF THE INVENTION (a) Field of the Invention

The present invention relates to a shift register and a gate driving circuit of a display device using the same, and more particularly to a shift register which can adjust a scan direction in the case where a screen of a display device is upside down, and a gate driving circuit of the display device using the same.

(b) Description of the Related Art

A display device that has recently been applied to a portable terminal may display images on a screen, a position of which is reversed, for example upside down or left and right, in accordance with a user's intention. In this case, a gate driving circuits of the display device need to be designed to change a scan direction and then output an image.

A conventional shift register, for example disclosed in Korean Patent No. 10-1020627, includes a plurality of thin film transistors (TFT).

FIG. 1 is a block diagram of a gate driving circuit, showing connection among the conventional shift registers capable of adjusting the scan direction.

FIG. 2 is a detailed circuit diagram illustrating an example of the conventional shift register shown as a block in FIG. 1.

Referring to FIG. 2, the conventional shift register includes an input unit 1 for receiving an input signal for the shifting operation, an inverter unit 2 for making off-characteristics of an output terminal better, a output unit 3 for outputting a scan input signal to a gate line, and a reset unit 4.

The input unit 1 receives a pulse input signal and transmits it to a P node (boosting node), and the inverter unit 2 inverts the signal of the P node, received from the input unit 1 and outputs the inverted signal to an X node.

In the conventional shift register, a TFT $T_B$ constituting the inverter unit 2 keeps always turned on by a high level voltage Vbias (a bias voltage), and thus there is a limit to invert the voltage of an X node on the contrary to the voltage of the P node.

Therefore, the conventional inverter unit 2 further need to include two TFTs $T_D$ and $T_1$ in addition to the TFTs $T_B$ and $T_C$, i.e., includes a total of four TFTs in order to compensate for insufficient driving performance for the TFTs and to secure reliability, and an LVGL signal is added to enhance the reliability.

Like this, the conventional shift register needs a plurality of thin film transistors and signal lines to improve the off-characteristics.

This causes a problem of enlarging a dead space of a display device, resulting in the display having bigger size than originally planned and modifying a structure of the gate driving circuit.

Further, a shift register of a recent gate driving circuit has additionally included a bidirectional driving function that changes order of supplying a signal to the gate line in accordance with rotation of a display screen. To this end, as shown in FIGS. 1 and 2, the conventional shift register has to include a scan direction adjuster 5 including four TFTs Tb, Tbr, Tf and Tfr. Thus, as the number of transistors increases for changing the order of supplying the signal to the gate line, the conventional shift register exacerbates the foregoing problems.

SUMMARY OF THE INVENTION

Accordingly, the present invention is conceived to solve the forgoing problems, and an aspect of the present invention is to provide a shift register and a gate driving circuit using the same, in which an inverter unit can operate with excellent reliability as it is controlled by coupling with a clock signal.

Another aspect is to provide a shift register and a gate driving circuit using the same, in which change in a signal connection state is enough for an input unit to do bidirectional scan and reset without adding any TFT.

Still another aspect is to provide a shift register and a gate driving circuit using the same, in which deterioration of a TFT can be minimized.

Still another aspect is to provide a shift register and a gate driving circuit using the same, in which initial driving can be stabilized.

The foregoing and other aspects of the invention may be achieved by a shift register and a gate driving circuit using the same according to an exemplary embodiment.

According to the invention, the gate driving circuit may include a plurality of shift registers connected in sequence to respectively supply scan signals to a plurality of gate lines of a display device.

According to an exemplary embodiment of the invention, the shift register may include: an input unit which outputs a directional input signal having a gate high voltage VGH or a gate low voltage VGL based on an output signal from a previous or subsequent shift register of the corresponding shift register to a first node; an inverter unit which is connected to the first node, generates an inverting signal to a signal at the first node, and outputs the inverting signal to a second node; and an output unit which includes a pull-up unit connected to the first node and activating an output clock signal based on the signal at the first node to be output as an output signal to a corresponding gate line, and a pull-down unit activating and outputting a pull-down output signal based on a signal at the second node, the inverter unit being controlled by coupling with a control clock signal.

According to an exemplary embodiment of the invention, the input unit may include a first switching device that includes a gate terminal to receive an output signal from the previous shift register, a drain to receive the directional input signal having the gate high voltage VGH or the gate low voltage VGL, and a source connected to the first node; and a second switching device that includes a gate terminal to receive an output signal from the subsequent shift register, a drain terminal to receive the directional input signal having the gate low voltage VGL or the gate high voltage VGH as opposed to the first switching device, and a source terminal connected to the first node.

According to an exemplary embodiment of the invention, the inverter unit may include: a first switching device that includes a gate terminal to receive the control clock signal through a capacitor, a drain terminal to receive the control clock signal, and a source terminal connected to the second node; a second switching device that includes a gate terminal connected to the first node, a drain terminal connected to the second node, and a source terminal connected to a base voltage terminal; and a third switching device that a gate terminal connected to first node, a drain terminal connected to the gate of the first switching device, and a source terminal connected to the base voltage terminal.

According to another exemplary embodiment of the invention, the inverter unit may include: a first switching device that includes a gate terminal to receive the control clock signal through a capacitor, a drain terminal to receive a bias voltage signal, and a source terminal connected to the second node; a second switching device that includes a gate terminal connected to the first node, a drain terminal connected to the second node, and a source terminal connected to a base voltage terminal; and a third switching device that includes a gate terminal connected to the first node, a drain terminal connected to the gate of the first switching device, and a source terminal connected to the base voltage terminal.

According to another exemplary embodiment of the invention, the shift register may further include a stabilizer for increasing a voltage at the second node by a gate start pulse.

According to an exemplary embodiment of the invention, the stabilizer may include a switching device that includes a gate terminal to receive the gate start pulse, a drain terminal to receive a bias voltage signal, and a source terminal connected to the second node.

According to still another exemplary embodiment of the invention, the shift register may further include a reset auxiliary unit that increases a voltage at the second node when a directional input signal having a gate low voltage VGL based on the output signal from the previous or subsequent shift register is input to the first node.

According to an exemplary embodiment of the invention, the reset auxiliary unit may include a first switching device that includes a gate terminal to receive the output signal from the subsequent shift register, a drain terminal to receive the directional input signal having a gate high voltage VGH or a gate low voltage VGL, and a source terminal connected to the second node; and a second switching device that includes a gate terminal to receive the output signal from the previous shift register, a drain terminal to receive the directional input signal having a gate low voltage VGL or a gate high voltage VGH on the contrary to the first switching device, and a source terminal connected to the second node.

According to still another exemplary embodiment of the invention, the shift register may further include a swing unit for periodically dropping a voltage at the second node in response to a swing clock signal.

According to an exemplary embodiment of the invention, the swing unit may include a switching device that includes a gate terminal to receive the swing clock signal, a drain terminal connected to the second node, and a source terminal connected to the base voltage terminal.

In such a shift register according to an exemplary embodiment, the gate start pulse (SIP) is supplied as an output signal for the previous shift register of the first shift register, so that the first to last shift registers can be driven in sequence in the forward driving. On the other hand, in the backward driving, the gate start pulse (STP) is supplied as an output signal for the subsequent shift register of the last shift register so that the last to first shift registers can be driven in sequence. Thus, screen conversion, i.e., bi-directional driving is possible without the conventional scan direction adjuster when the display panel is reversed upside down.

BRIEF DESCRIPTION OF THE DRAWINGS

The above and/or other aspects of the present invention will become apparent and more readily appreciated from the following description of the exemplary embodiments, taken in conjunction with the accompanying drawings, in which.

DETAILED DESCRIPTION OF THE EMBODIMENTS

To supply scan signals to a plurality of gate lines of a display device, shift registers according to an exemplary embodiment of the invention are sequentially connected to the gate lines, respectively.

That the gate driving circuits employing the shift register are placed on both sides of a display panel and respectively drive odd (1, 3, 5, ...) gate lines and even (2, 4, 6, ...) gate lines divisionally will be called a dual type arrangement of gate driving circuit, and that one or more gate driving circuits are placed in one-side of the display panel and drive each of the gate lines will be called a single type arrangement of gate driving circuit.

Figure 3:
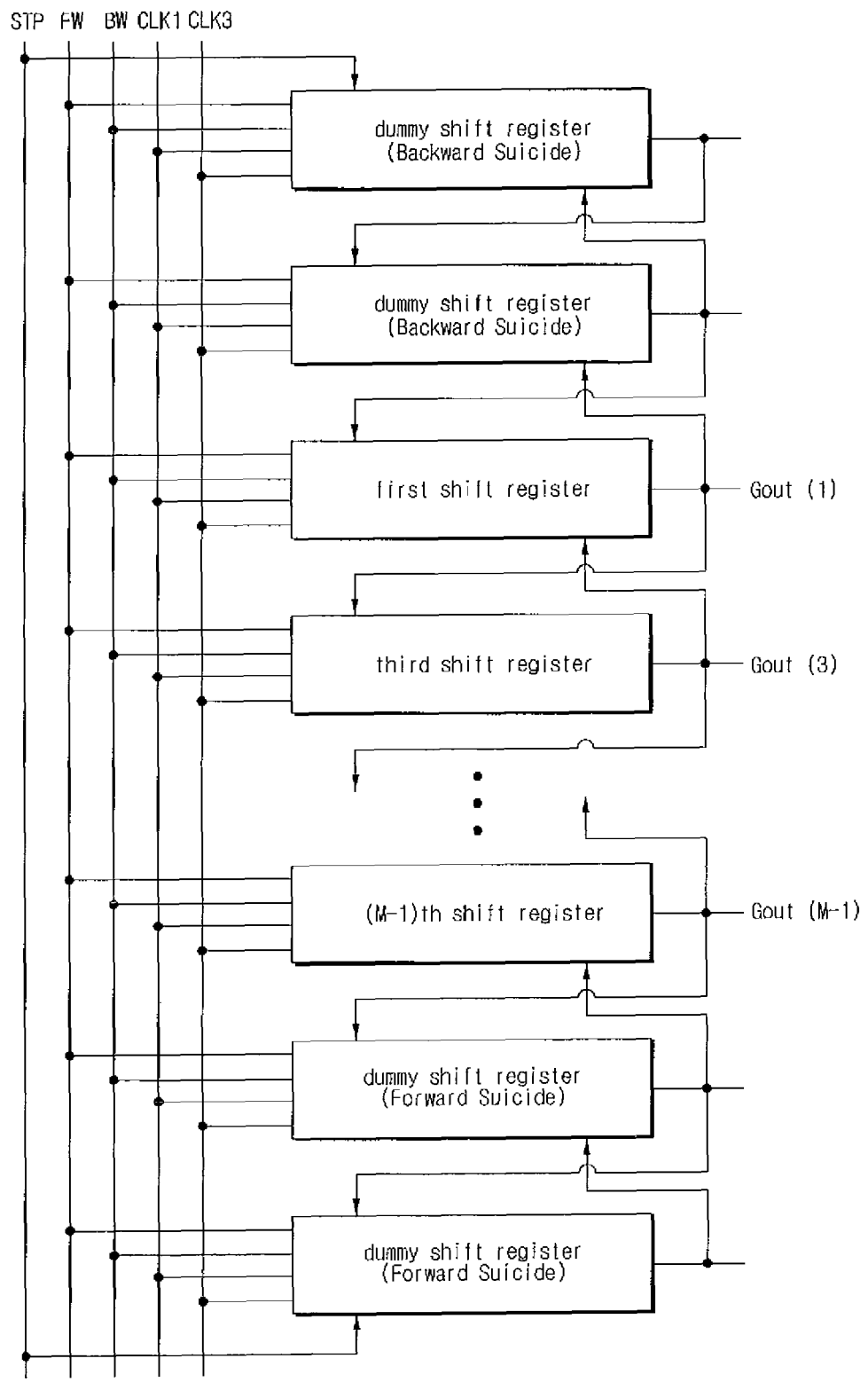
FIG. 3 is a block diagram of a gate driving circuit according to an exemplary embodiment of the invention.

Also, dummy shift registers are respectively placed in the front and rear of the sequentially connected shift registers. The dummy shift registers have the same structure as the shift registers. In the case of forward driving, the output signal of the dummy shift register (forward suicide) resets the last shift register. In the case of backward driving, the output signal of the dummy shift register (backward suicide) resets the first shift register. The output signal of the dummy shift register has no effect on the display area. The gate driving circuit shown in FIG. 3 illustrates a configuration of one-side gate driving circuit for driving the odd lines in the dual type gate driving circuit, and the first two and last two are the dummy shift registers. Each of the shift registers receives a forward input signal FW and a backward input signal BW. The forward input signal FW has a gate high voltage VGH in the case of the forward driving and has a gate low voltage VGL in the case of the backward driving. On the other hand, the backward input signal BW has a gate low voltage VGL in the case of the forward driving and has a gate high voltage VGH in the case of the backward driving.

Also, two clock signals CLK1 and CLK3 are used as a control clock signal and an output clock signal for an inverter unit. For example, the odd-ordered (1, 5, 9, ...) shift registers use the clock signal CLK1 as an output signal and use the clock signal CLK3 for controlling the inverter unit of the shift register. The even-ordered (3, 7, 11, ...) shift registers use the clock signal CLK3 as an output signal and use the clock signal CLK1 for controlling the inverter unit.

In the case of the single type, the forward input signal FW and the backward input signal BW are applied, and two clock signals CLK and CLKB having a phase difference of 180 degrees from each other are used for control of the inverter unit and the output signal. For example, the odd-ordered (1, 3, 5, ...) shift registers use the clock signal CLK as an output signal and use the clock signal CLKB for controlling the inverter unit of the shift register. The even-ordered (2, 4, 6, ...) shift registers use the clock signal CLKB as an output signal and use the clock signal CLK for controlling the inverter unit.

Figure 4:
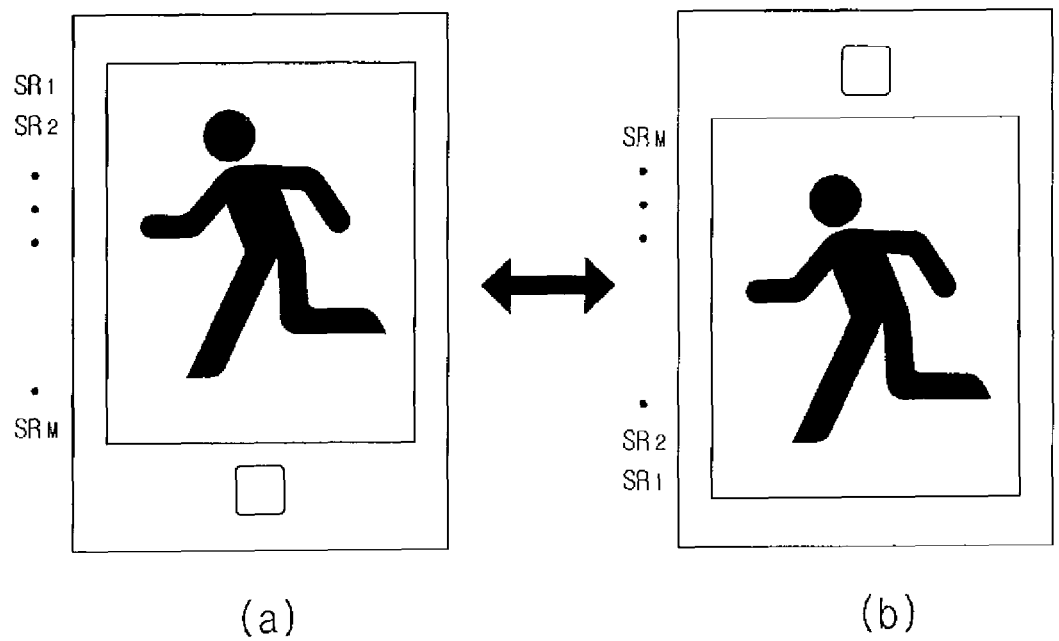
FIG. 4 is a view showing a bidirectional drivable liquid crystal display (LCD) panel.

The gate driving circuit drives the first dummy shift register as a gate start pulse STV is applied to the first dummy shift register in the case of the forward driving, and the output signal from the first dummy shift register drives the second dummy shift register. In such a manner, the first shift register $SR_1$ to the last shift register $SR_M$ are sequentially driven so that a screen can be output as shown in FIG. 4.

On the other hand, if a display panel is reversed upside down and driven backward, the gate start pulse drives the last dummy shift register, and the output signal from the last dummy shift register $SR_N$ drives the last dummy shift register $SR_{N-1}$ but one. In such a manner, the last shift register $SR_N$ to the first shift register $SR_1$ are sequentially driven. Thus, even though the display panel is reversed upside down as shown in FIG. 4(b), the same image as shown in FIG. 4(a) is displayed without being upside down.

Figure 5:
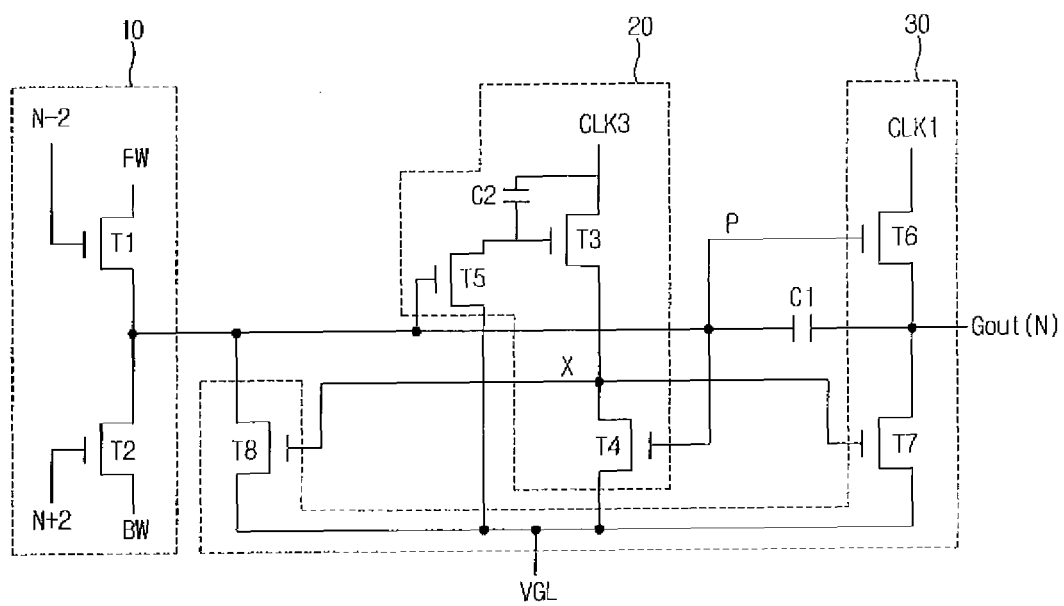
FIG. 5 is a detailed circuit diagram of a shift register according to a first exemplary embodiment of the invention.

FIG. 5 shows a first exemplary embodiment of a shift register used in the gate driving circuit of FIG. 3.

A configuration of the shift register in this exemplary embodiment is as follows.

1. Input Unit

The input unit 10 in this exemplary embodiment receives the forward input signal FW based on the output signal of the previous shift register, and receives the backward input signal BW based on the output signal of the subsequent shift register.

The forward input signal FW is a gate high voltage VGH in the case of the forward driving, and a gate low voltage VGL in the case of the backward driving. On the other hand, the backward input signal BW is a gate low voltage VGL in the case of the forward driving, and a gate high voltage VGH in the case of the backward driving.

The input unit 10 transmits the input signal to a P node (or called a bootstrap node) connected to an output terminal Gout (N).

Such an input unit 10 may include two switching devices T1 and T2 as shown in FIG. 5. The switching device T1 has a gate terminal to receive the output signal from the previous shift register, a drain terminal to receive the forward input signal, and a source terminal connected to the P node. The switching device T2 has a gate terminal to receive the output signal from the subsequent shift register, a drain terminal to receive the backward input signal, and a source terminal connected to the P node.

In comparison with the conventional structure (refer to FIG. 2), the input unit 10 in this exemplary embodiment of the invention can remove the scan direction adjuster 5 including four thin film transistors Tb, Tbr, Tf and Tfr only using change of signal lines.

Also, the voltage of the P node increased by the forward input signal FW applied by the switching device T1 in the case of the forward driving can be reset by the backward input signal BW applied by the switching device T2 (and vice versa in the case of the backward driving). Thus, the input unit 10 in this exemplary embodiment of the invention also serves as the conventional reset unit 4 and thus there is no need of the conventional reset unit 4.

Therefore, the input unit 10 in this exemplary embodiment of the invention makes a circuit configuration simpler than that of the conventional one, and reduces a dead space.

Meanwhile, in the case of the dual type where the gate driving circuits are arranged at both sides of the display panel and each divisionally drives the odd-numbered and even-numbered gate lines, if this circuit is an Nth shift register, the output signal from the previous shift register becomes the output signal Gout (N−2) of the (N−2)th shift register, and the output signal from the subsequent shift register becomes the output signal Gout (N+2) of the (N+2)th shift register.

As opposed to the dual type, in the case of the single type where the gate driving circuit is arranged at one side on the display panel, the output signal from the previous shift register of an Nth shift register becomes the output signal Gout (N−1) of the (N−1)th shift register, and the output signal from the subsequent shift register becomes the output signal Gout (N+1) of the (N+1)th shift register.

Further, the output signal of the previous shift register of the first dummy shift register and the output signal of the subsequent shift register of the last dummy shift register are used as the gate start pulses STP.

2. Inverter Unit

The inverter unit serves to generate an inverting signal with regard to a signal at the P node and output it to an X node.

Basically, the inverter unit includes a TFT T4 driven when a voltage at the P node increases and decreasing a voltage at the X node, and a TFT T3 driven when the voltage at the P node increases and increasing the voltage at the X node.

Therefore, the TFT T3 has to be turned off while the voltage at the P node increases and the shift register is driven as the input signal having the gate high voltage VGH is input, and turned on to increase the voltage at the X node if the voltage at the P node decreases as being reset by the input signal having the gate low voltage VGL.

However, the TFT of the shift register uses only the N-type TFT, and thus the input signal cannot do perfect inverting. Therefore, there is a need of turning on/off the TFT T3.

Conventionally, the TFT T3 was turned on/off by adding one inverter or connecting a clock signal to an introduction of the T3. However, the inverter added to the introduction is not so perfectly do inverting that the inverter unit cannot be perfectly controlled. Also, in the case of directly connecting the clock signal, the timing of the signal is fixed and therefore the number of clock signals used in the shift register has to be disadvantageously increased.

Thus, according to an exemplary embodiment of the invention, the inverter unit is controlled by coupling with a control clock signal. The control of the inverter unit based on the coupling with the control clock signal refers to that the inverter unit is turned on when a signal at the gate terminal of the TFT T3 is synchronized with the input control clock signal and tuned off when the signal at the gate terminal is not synchronized with the input clock signal.

For the above coupling, the gate terminal of the TFT T3 is designed to receive the clock signal through a capacitor C2. Also, the gate terminal of the TFT T3 has to keep a floating state for time of the coupling, and keep always turned off while the shift register is driven (i.e., from time when the shift register starts to operate by the gate high voltage to time when the shift register is reset by the gate low voltage).

To this end, the inverter in this exemplary embodiment of the invention may be configured to include three switching devices T3, T4 and T5 as shown in FIG. 5.

That is, the gate terminal of the TFT T3 receives a control clock signal CLK3 through the capacitor, the drain terminal receives an external voltage (e.g., the clock signal CLK3 in FIG. 3), and the source terminal is connected to the X node. The gate terminal of the TFT T4 is connected to the P node, the drain terminal is connected to the X node, and the source terminal is connected to a base voltage terminal VGL. The gate terminal of the TFT T5 is connected to the P node, the drain terminal is connected to the gate of the TFT T3, and the source terminal is connected to the base voltage terminal VGL.

Figure 1:
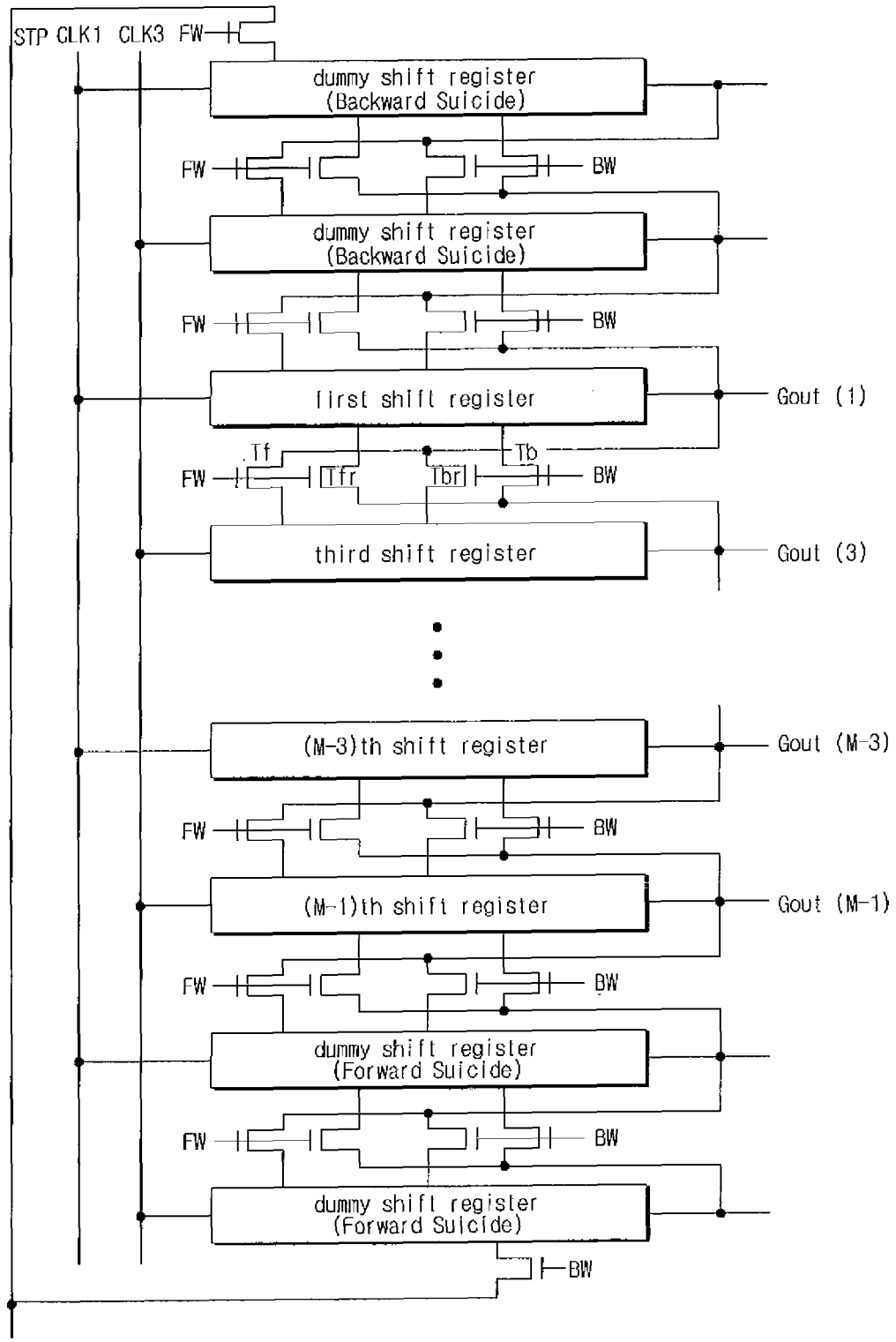
FIG. 1 is a block diagram of a conventional gate driving circuit capable of adjusting a scan direction.
Figure 2:
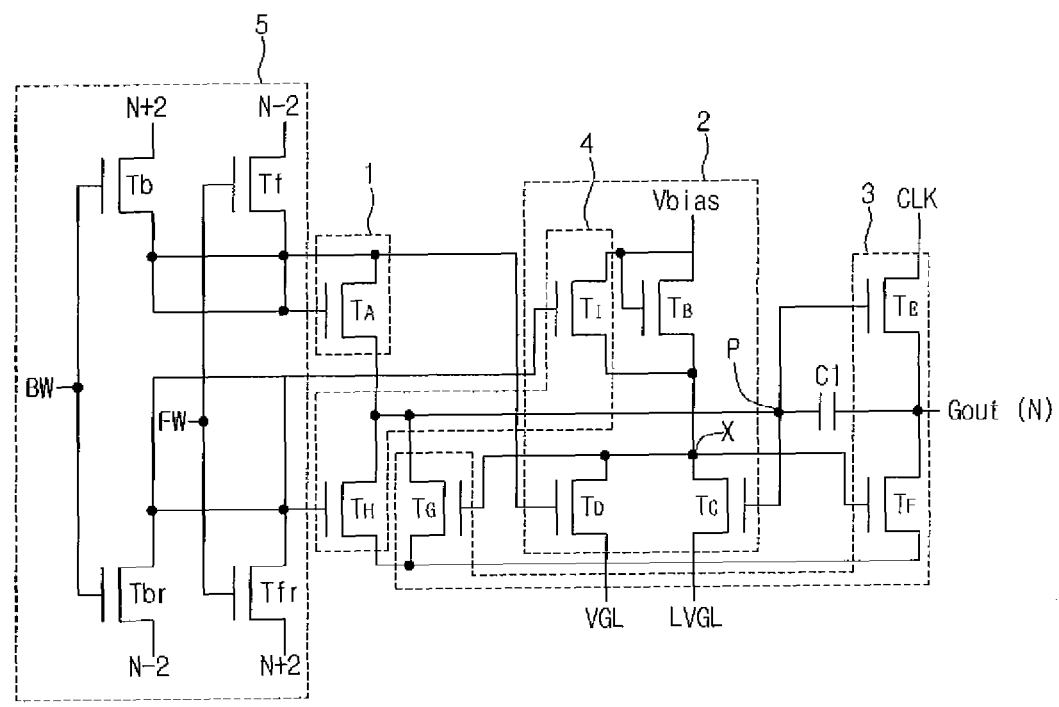
FIG. 2 is a detailed circuit diagram showing an example of a conventional shift register.

The conventional inverter unit 2 shown in FIG. 2 employs four TFTs and an LVGL signal to secure reliability, but the inverter unit 20 in this exemplary embodiment of the invention can achieve desired features with three TFTs and one capacitor since the control is based on the coupling with the control clock signal and is more preferable than the conventional one since there is no need of the LVGL signal.

3. Output Unit

The output unit 30 in this exemplary embodiment of the invention is the same as the conventional output unit shown in FIG. 2 and thus its configuration and functions will be described in brief.

The output unit 30 is connected to the P node and the X node. The output unit 30 includes a pull-up unit synchronized with the output clock signal CLK1 and outputting a signal of the P node as a pull-up output signal, and a pull-down unit outputting a pull-down signal by a signal of the X node.

The pull-up unit includes a TFT T6. The TFT T6 has a gate terminal connected to the P node, a drain terminal to receive the output clock signal, and a source terminal connected to the output terminal Gout(N) connected to the P node.

A capacitor C1 may be provided between the gate and the source of the TFT T6, in which the capacitor C1 is synchronized with the output clock signal and causes a bootstrap phenomenon, thereby making an output characteristic of the output terminal Gout(N). The pull-down unit includes TFTs T7 and T8. The TFT T7 has a gate terminal connected to the X node, a drain terminal connected to the output terminal Gout (N), and a source terminal connected to the base voltage terminal VGL. The TFT T8 has a gate terminal connected to the X node, a drain terminal connected to the P node, and a source terminal connected to a base voltage terminal VGL. The TFTs T7 and T8 of the pull-down unit may also be called a stabilizing device for continuously maintaining the voltage states of the P node and the output terminal N Gout as the base voltage VGL while the P node is reset.

4. Clock Signal

Referring to FIG. 5, the output clock signal CLK1 and the control clock signal CLK3 are signals that swing to a high level VGH once per 4 H period, and the CLK1 is earlier than the CLK3 by 2 H. Here, 1 H refers to a pulse width of a clock signal, which is calculated as one frame time(1/frequency/the number of gate lines).

The shift register according to an exemplary embodiment of the invention may be achieved in various forms on the basis of the above configurations, which will be described with reference to the first to seventh exemplary embodiments.

First Exemplary Embodiment (1) Configuration

As shown in FIG. 5, the shift register according to the first exemplary embodiment includes eight switching devices TFT: T1~T8 as follows.

The first switching device T1 has a gate terminal connected to an output terminal of the previous shift register N−2 or N−1, a drain terminal to receive the forward input signal FW, and a source terminal connected to the P node. The forward input signal has a VGH in the case of the forward driving and a VGL in the case of the backward driving.

The second switching device T2 has a gate connected to an output terminal of the subsequent shift register N+2 or N+1, a drain terminal to receive a backward input signal, and a source terminal connected to the P node. The backward input signal has a VGL in the case of the forward driving and a VGH in the case of the backward driving.

The third switching device T3 has a gate terminal to receive the control clock signal CLK3 or CLK1 through the capacitor, a drain terminal to receive the control clock signal CLK3 or CLK1, and a source terminal connected to the X node.

The fourth switching device T4 has a gate terminal connected to the P node, a drain terminal connected to the X node, and a source terminal connected to the base voltage terminal VGL.

The fifth switching device T5 has a gate terminal connected to the P node, a drain terminal connected to the gate of the third switching device T3, and a source terminal connected to the base voltage terminal VGL.

The sixth switching device T6 has a gate terminal connected to the P node, a drain terminal to receive the output clock signal (a clock signal different from the control clock signal, i.e., CLK1 or CLK3), and a source terminal connected to the output terminal.

The seventh switching device T7 has a gate terminal connected to the X node, a drain terminal connected to the output terminal, and a source terminal connected to the base voltage terminal VGL.

The eighth switching device T8 has a gate terminal connected to the X node, a drain terminal connected to the P node, and a source terminal connected to the base voltage terminal VGL.

The devices T1 and T2 correspond to the input unit 10, the devices T3 to T5 correspond to the inverter unit 20, and the devices T6 to T8 correspond to the output unit 30.

(2) Operation

1) Forward Driving

According to the first exemplary embodiment, operations at the forward driving are as follows.

If the output signal from the previous ((N−2)th or (N−1)th) shift register is supplied to the gate of the device T1 of the Nth shift register, the device T1 is turned on so that the forward input signal FW having the VGH can be input to the P node.

The voltage at the P node is increased by the VGH input signal, and the devices T4, T5 and T6 are turned on. As the device T5 is turned on, the gate voltage of the device T3 is dropped into VGL and the device T3 is turned off. Also, as the device T4 is turned on, the voltage at the X node is dropped into VGL. When the voltage at the X node is dropped into a VGL level, the devices T7 and T8 are turned off.

After the input signal is input, the device T1 is turned off and the voltage at the P node is maintained to keep a floating state. The device T6 also keeps an 'ON' state for the same time as the P node, and outputs a waveform of the output clock signal to the output terminal Gout(N) in response to the output clock signal CLK1.

This output signal is input to the device T2 of the previous shift register in order to reset the previous shift register and at the same time input to the subsequent shift register T1 in order to drive the subsequent shift register.

If the output signal is input to the device T1 of the subsequent shift register, the subsequent shift register is also driven by the foregoing operations. If the output clock signal CLK3 is input to the device T6 of the subsequent shift register, the output signal is input to the device T2 of the Nth shift register in order to reset the Nth shift register.

If the output signal from the subsequent shift register is supplied to the gate terminal of the device T2, the device T2 is turned on so that the backward input signal of VGL can be input to the P node.

If the P node is reset in response to the backward input signal BW and its voltage is dropped into a VGL level, the devices T4, T5 and T6 are turned off. As the device T5 is turned off, the gate terminal of the device T3 becomes a floating state. At this time, if the control clock signal CLK3 is supplied, the gate terminal of the device T3 is coupled with the control clock signal so that the voltage can increases up to a VGH level, thereby turning on the device T3.

If the device T3 is turned on, the control clock signal CLK3 is supplied to the X node and the voltage at the X node increases. If the voltage at the X node increases to the VGH, the TFTs T7 and T8 are turned on and the voltages of the P node and the output signals Gout(N) maintain the VGL.

2) Backward Driving

According to the first exemplary embodiment of the invention, operations at the backward driving are as follows.

On the contrary to the forward driving, if the subsequent ((N+2)th or (N+1)th) shift register is first driven and its output signal is supplied to the gate of the device T2, the device T2 is turned on so that the backward input signal BW of VGH can be input to the P node.

Operations from the input of the BW input signal to the output of the output signal are the same as those of the forward driving. However, differently from the forward driving, the output signal of the Nth shift register is used as a signal for driving the previous shift register and used as a signal for resetting the subsequent shift register.

The Nth shift register is reset as the output signal of the previous ((N−2)th or (N−1)th) shift register is supplied to the gate terminal of the device T1 and the T1 is turned on so that the forward input signal of VGL is input to the P node. Resetting operations based on the forward input signal FW are the same as those of the forward driving.

Figure 6:
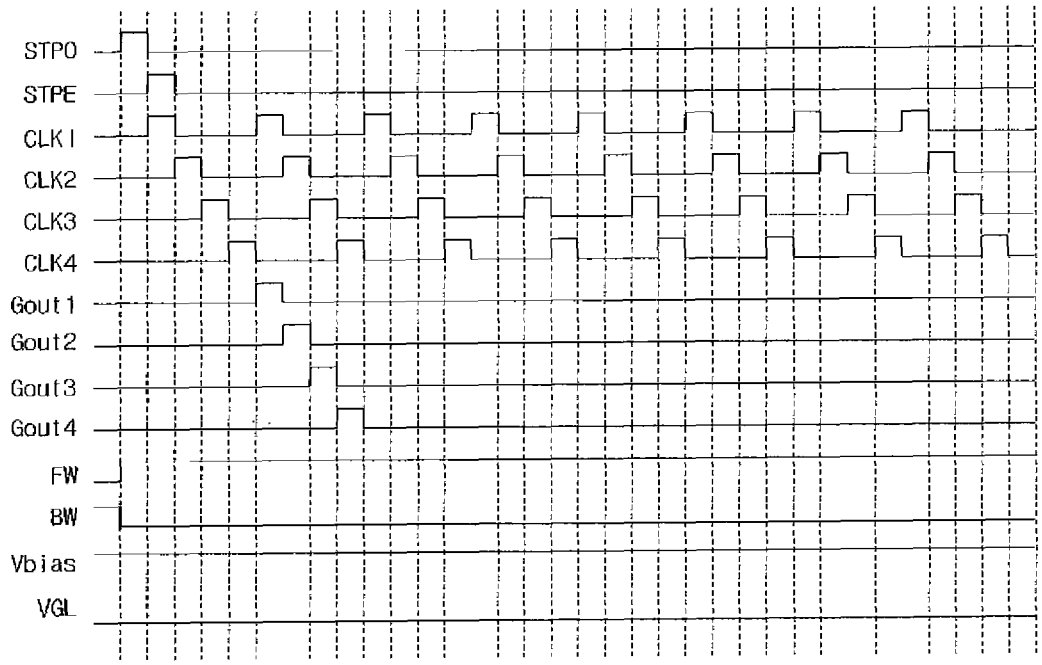
FIG. 6 is a forward timing diagram when a gate driving circuit employing the shift register of FIG. 5 is installed by a dual type.
Figure 7:
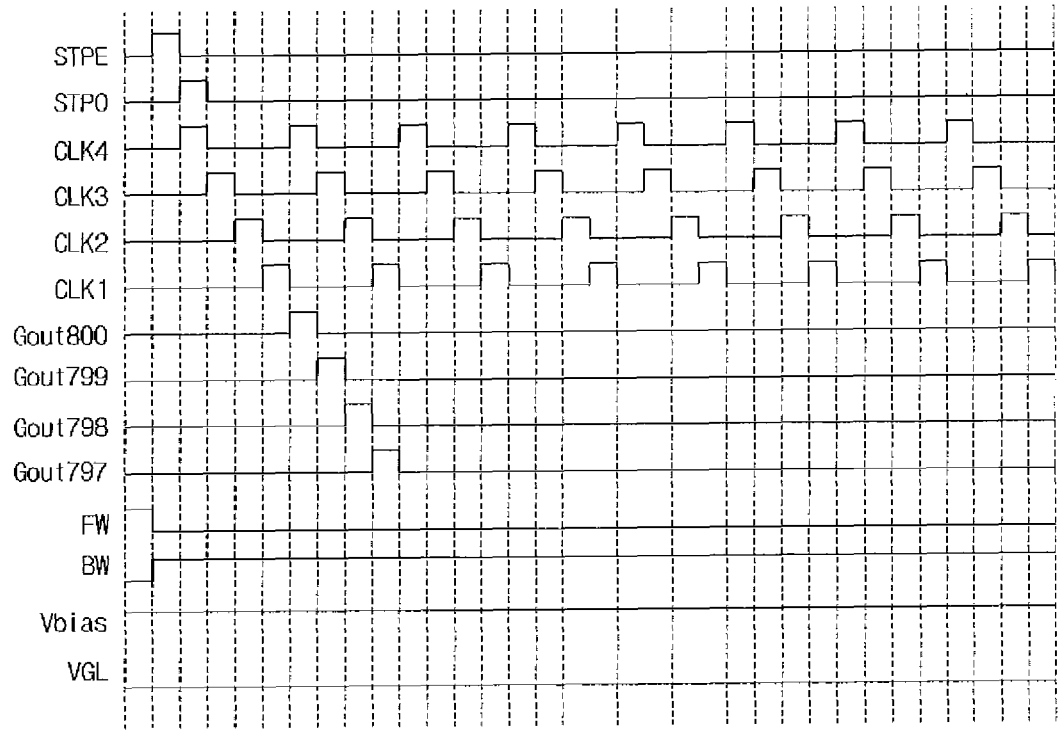
FIG. 7 is a backward timing diagram when a gate driving circuit employing the shift register of FIG. 5 is installed by a dual type.

The foregoing operations of the shift register will be ascertained through the timing diagrams of FIGS. 6 and 7.

FIG. 6 is a forward timing diagram of a dual type where the gate driving circuits employing the shift register of FIG. 5 are installed at the both sides of the display panel, in which the odd-ordered shift registers use the clock signals CLK1 and CLK3 as the output and the control clock signal for the inverter unit, and the even-ordered shift registers use the clock signals CLK2 and CLK4 as the output and the control clock signal for the inverter unit.

In the case of the forward driving, as shown in FIG. 6, the output signals Gout1, 2, 3 and 4 are output in order from the first gate line to the last gate line on the basis of the clock signal CLK1, 2, 3 and 4 input in sequence after the STP (start signal).

In the case of the backward driving, as shown in FIG. 7, the clock signals CLK3, 2 and 1 are sequentially received with the clock signal CLK4 at the head after the STP (start signal). Accordingly, the gate driving circuit outputs the output signals Gout800, 799, 798 and 797 in order from the last gate line to the first gate line.

The reason why there are four dummy clock signals before the output Gout of the shift register is because the first and last two dummy shift registers among the shift registers sequentially connected as shown in FIG. 3 have to be driven at the bidirectional driving.

Second Exemplary Embodiment

Figure 8:
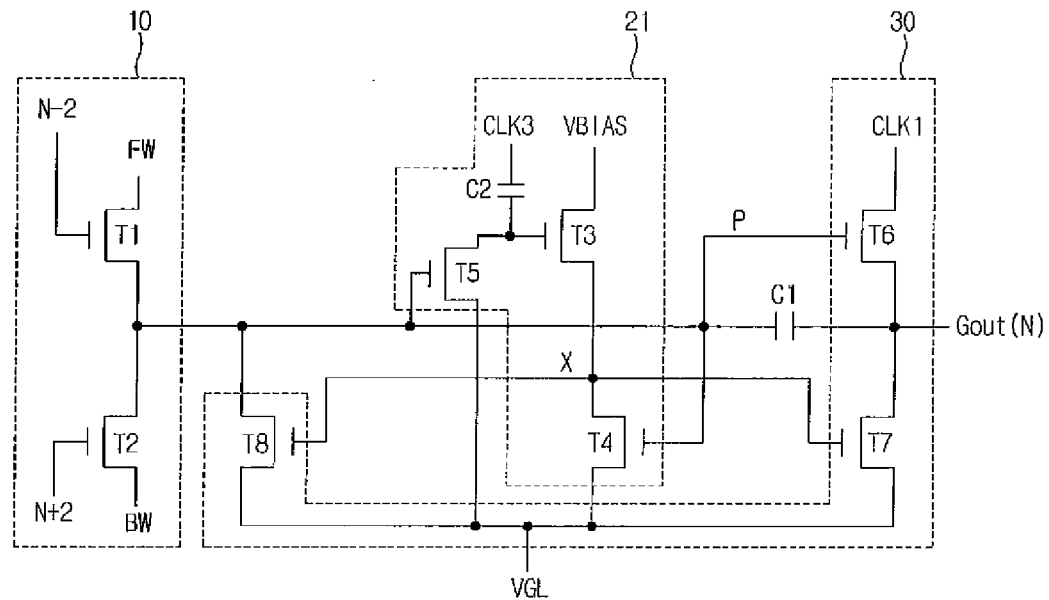
FIG. 8 is a detailed circuit diagram of a shift register according to a second exemplary embodiment of the invention.

FIG. 8 illustrates a detailed circuit diagram of a shift register according to a second exemplary embodiment of the invention.

The second exemplary embodiment shows the same configurations as the input unit 10 and the output unit 30 of the first exemplary embodiment, but is different in an inverter unit. That is, on the contrary to the inverter unit 20 of the first exemplary embodiment of the invention, an inverter unit 21 of the second exemplary embodiment of the invention inputs a high level voltage signal VBIAS (a bias voltage signal) instead of the control clock signal CLK3 to the drain terminal of the device T3.

In the first exemplary embodiment, a high voltage at the X node always has a voltage VGH. On the other hand, in the second exemplary embodiment, the high voltage at the X node can be adjusted by a bias voltage, and thus it is possible to reduce stress applied to the devices T7 and T8.

Figure 9:
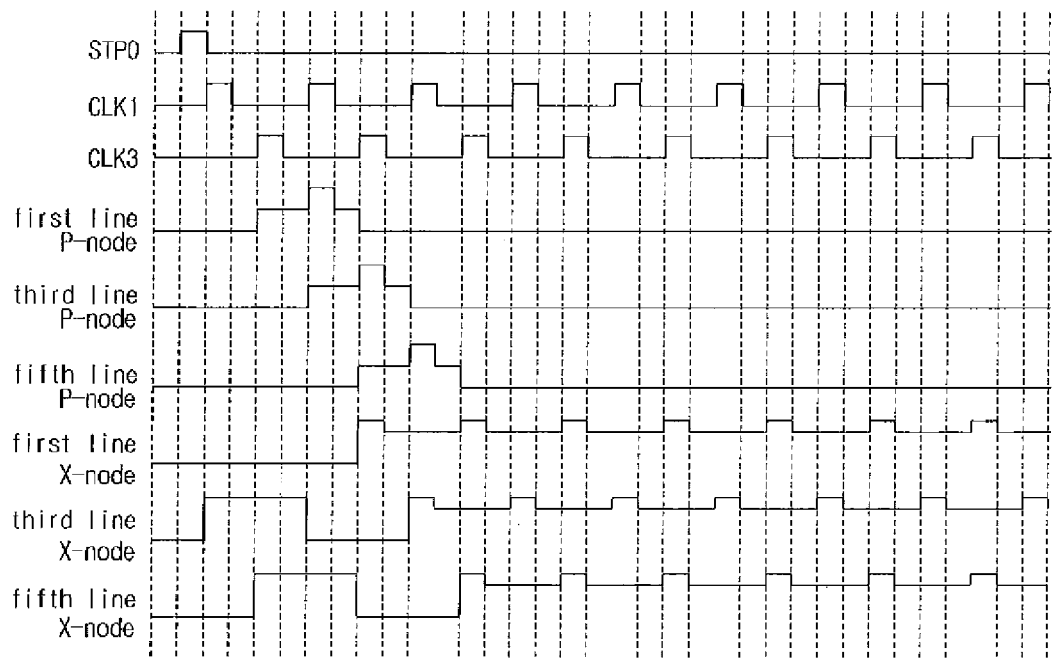
FIG. 9 is a timing diagram at a P node and an X node in a basic shift register according to an exemplary embodiment of the invention.

The second exemplary embodiment has the same operation as the first exemplary embodiment, and thus repetitive descriptions thereof will be avoided. When the shift register of one-side gate driving circuit for driving the odd lines in the dual type gate driving circuit is configured like the first and second exemplary embodiment, the timing diagrams at the X and P nodes are as shown in FIG. 9. Referring to FIG. 9, if the voltage at the P node is increased by the inverter unit, the voltage at the X node is dropped. After the reset, the P node keeps a voltage of VGL and the X node keeps a voltage increased by the control clock signal.

Third Exemplary Embodiment

Figure 10:
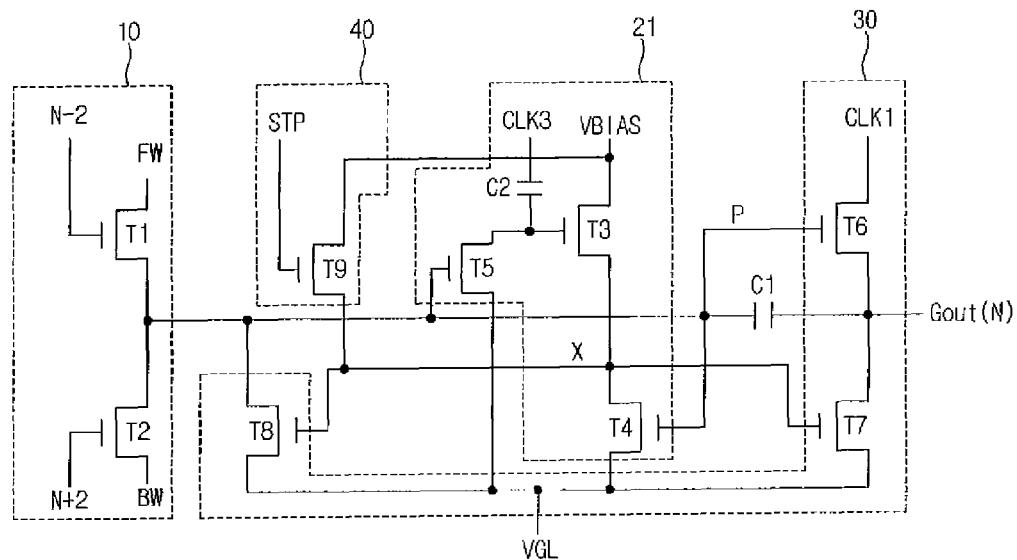
FIG. 10 is a detailed circuit diagram of a shift register according to a third exemplary embodiment of the invention.

FIG. 10 is a detailed circuit diagram of a shift register according to a third exemplary embodiment of the invention.

The third exemplary embodiment further includes a stabilizer 40 for increasing the voltage at the X node by the gate start pulse (STP), compared with the second exemplary embodiment.

For example, the stabilizer 40 may be configured by a switching device T9 that has a gate terminal to receive the gate start pulse, a drain terminal to receive the bias voltage signal, and a source terminal connected to the X node.

Figure 11:
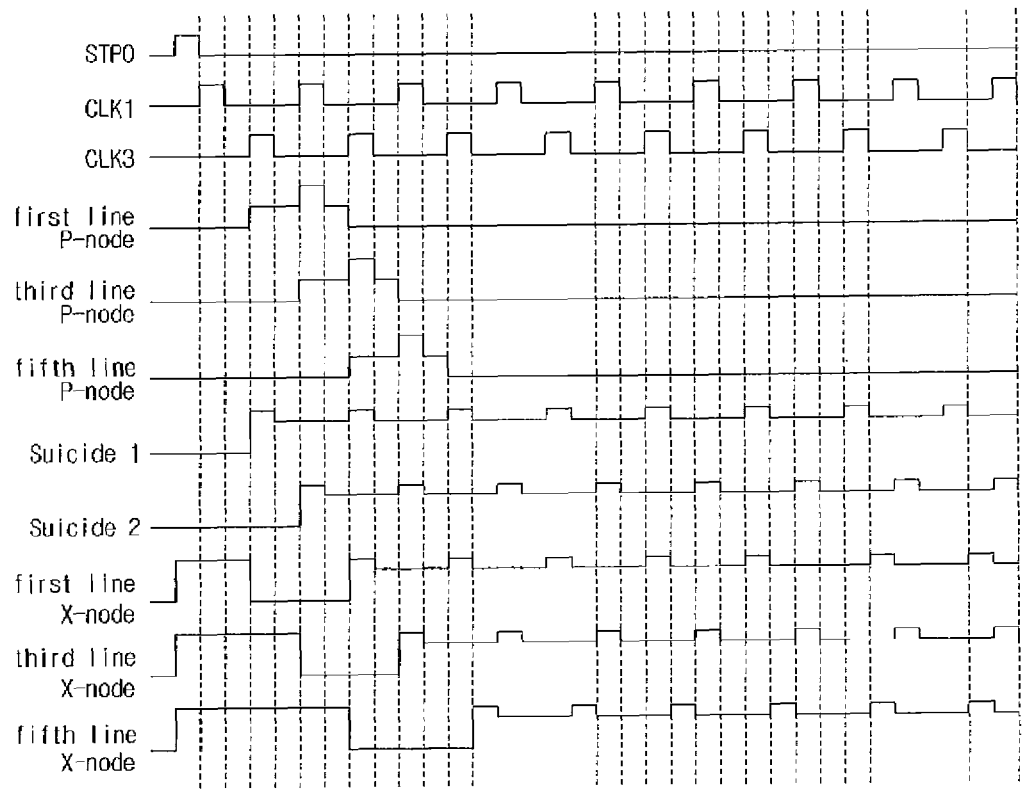
FIG. 11 is a timing diagram at a P node and an X node in a shift register provided with a stabilizer according to a exemplary embodiment of the invention.

The stabilizer 40 makes each shift register have a high-level voltage at the X node at the initial driving as shown in the timing diagram of FIG. 11 and turn on the devices T7 and T8. Thus, the voltages at the P node and the output terminal are stabilized into a base voltage state, and it is therefore possible to close off probability of abnormal driving at the first frame.

Figure 12:
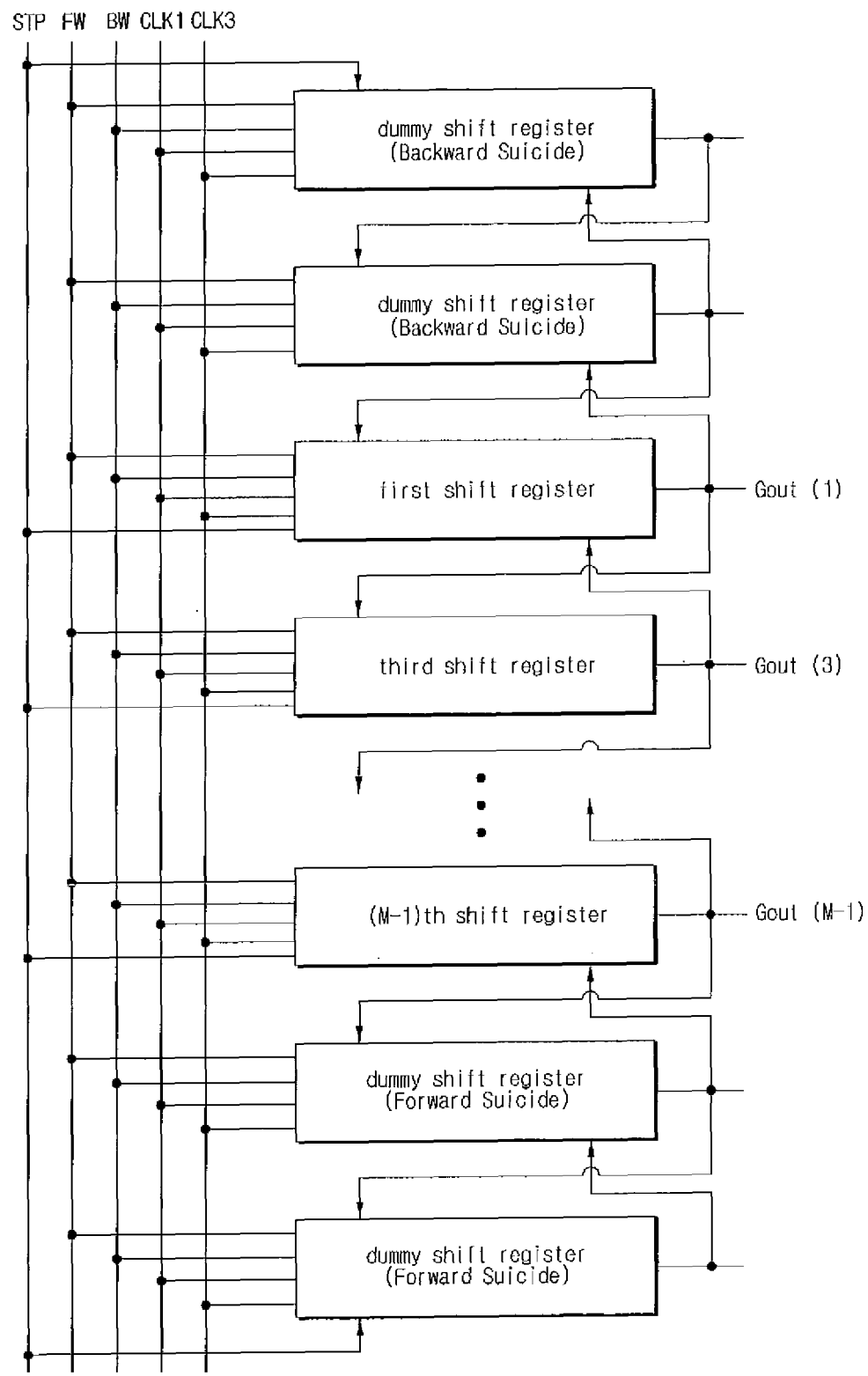
FIG. 12 is a block diagram of a gate driving circuit employing the shift register of FIG. 10.

However, the STP signal supplied to the stabilizer 40 is not supplied to the dummy shift register as shown in FIG. 12. This is because if the first two dummy shift registers driven by receiving the STP signal is reset by the STP signal, the input timing and the reset timing are overlapped and normal driving is disabled. The third exemplary embodiment has the same operation as the first and second exemplary embodiments except that the voltage at the X node has a high level and the devices T7 and T8 are being turned on when the shift register starts being driven, and thus repetitive descriptions thereof will be avoided.

Fourth Exemplary Embodiment

Figure 13:
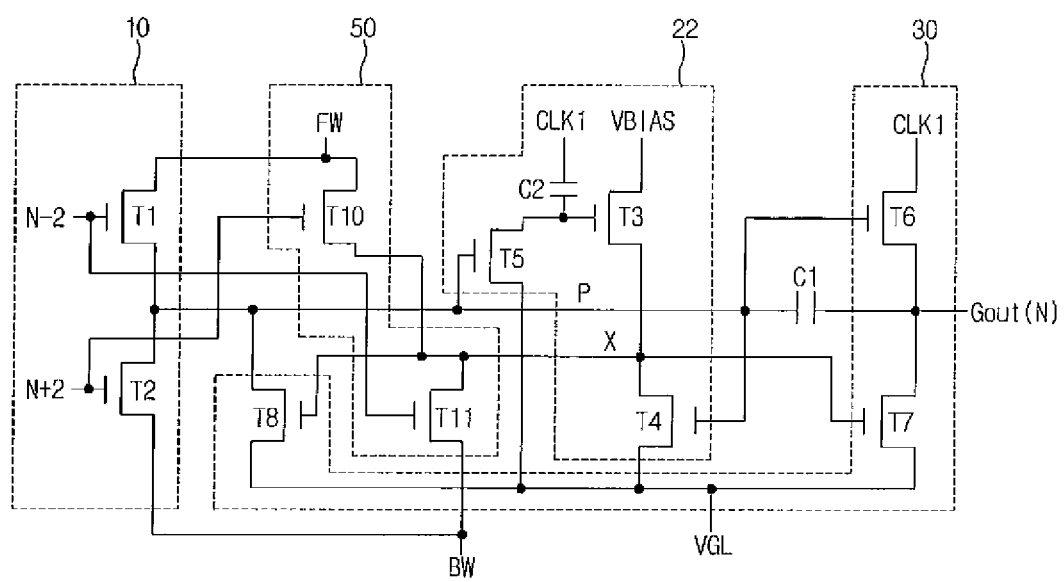
FIG. 13 is a detailed circuit diagram of a shift register according to a fourth exemplary embodiment of the invention.

FIG. 13 is a detailed circuit diagram of a shift register according to a fourth exemplary embodiment of the invention.

The fourth exemplary embodiment shows the same configurations as the input unit 10 and the output unit 30 of the first to third exemplary embodiment, but is different in an inverter unit.

As opposed to the inverter units 20 and 21 of the first to third exemplary embodiments, an inverter unit 22 of the fourth exemplary embodiment is controlled by the same clock signal as the output clock signal CLK1 or CLK3 for the output signal.

In the shift register according to the first to third shift registers, if the clock signal CLK1 is supplied to the device T6 in a reset state, the P node is coupled and generates a ripple and thus the device T4 may be driven by the ripple to thereby leak the voltage at the X node.

On the other hand, in the fourth exemplary embodiment, the device T3 is controlled by the same clock signals CLK1 or CLK3, and therefore the device T3 is turned on at the timing when the ripple is generated, so that the voltage at the X node can be raised up to a high level, thereby enhancing reliability and stability.

Figure 14:
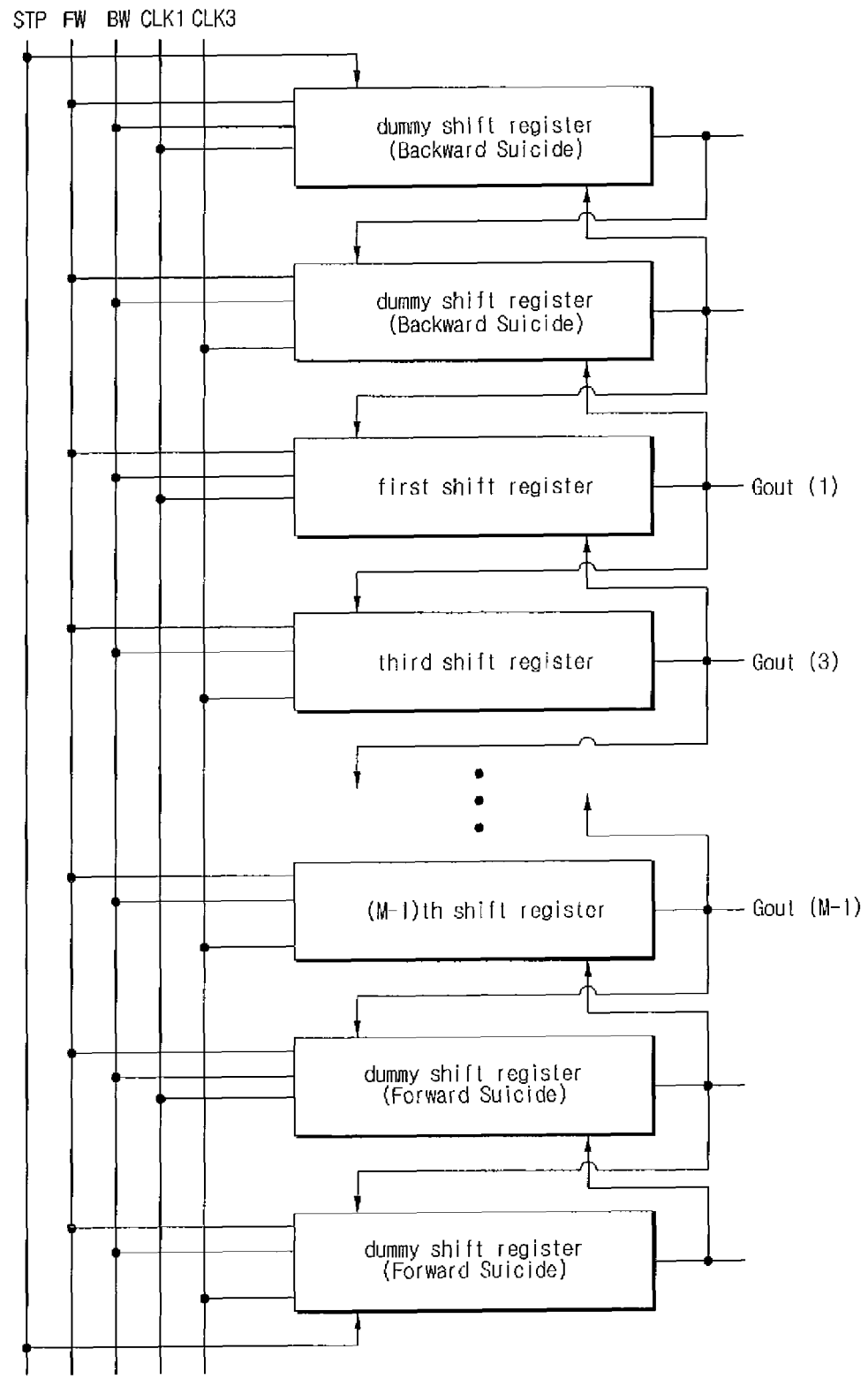
FIG. 14 is a block diagram of a gate driving circuit employing the shift register of FIG. 13.

Further, as shown in FIG. 14, only one clock signal CLK1 or CLK3 is enough for each shift register to control the output and the inverter unit, so that the circuit can have a simpler configuration.

In this exemplary embodiment, the inverter units 20 and 21 of the first to third exemplary embodiments may be replaced with the inverter 22.

However, if the output and the inverter unit are controlled by one clock signal, there is a time difference of 2 H between timing of reset signal input and a time when the device T3 is turned on to increase the voltage at the X node (i.e., a time difference between CLK1 and CLK3). Thus, when the reset signal is input (i.e., when the VGL input signal is input to the P node by the output signal from the previous or subsequent shift register), a reset auxiliary unit 50 may be provided to directly increase the voltage at the X node.

As shown in FIG. 13, the reset auxiliary unit 50 may include a switching device T10 that has a gate terminal to receive the output signal from the subsequent shift register, a drain terminal to receive the forward input signal FW (VGH at the forward driving but VGL at the backward driving), and a source terminal connected to the X node, and a switching device T11 that has a gate terminal to receive the output signal from the previous shift register, a drain terminal to receive the backward input signal BW (VGL at the forward driving but VGH at the backward driving), and a source terminal connected to the X node.

Figure 15:
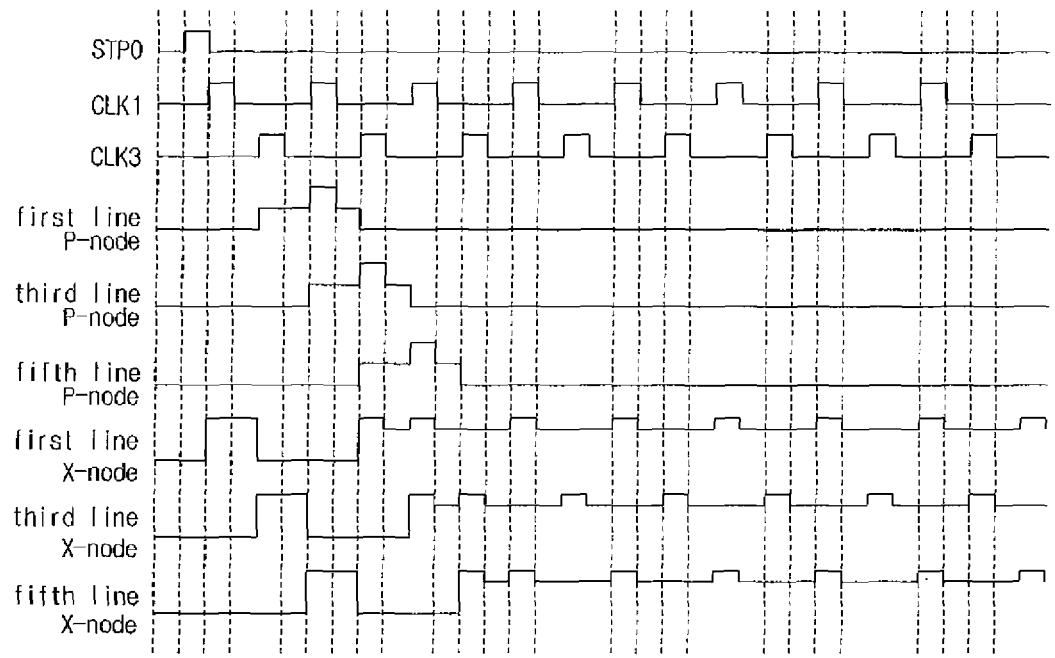
FIG. 15 is a timing diagram at a P node and an X node in a shift register provided with a reset auxiliary unit according to a exemplary embodiment of the invention.

At this time, the timing diagrams of the X and P nodes are shown in FIG. 15, and the voltage at the X node is immediately increased 2 H before receiving the control clock signal.

The fourth exemplary embodiment has the same operations as the first to third exemplary embodiments except the inverter unit 22 is controlled by the same clock signal as the output clock signal, and thus repetitive descriptions thereof will be avoided.

Fifth Exemplary Embodiment

Figure 16:
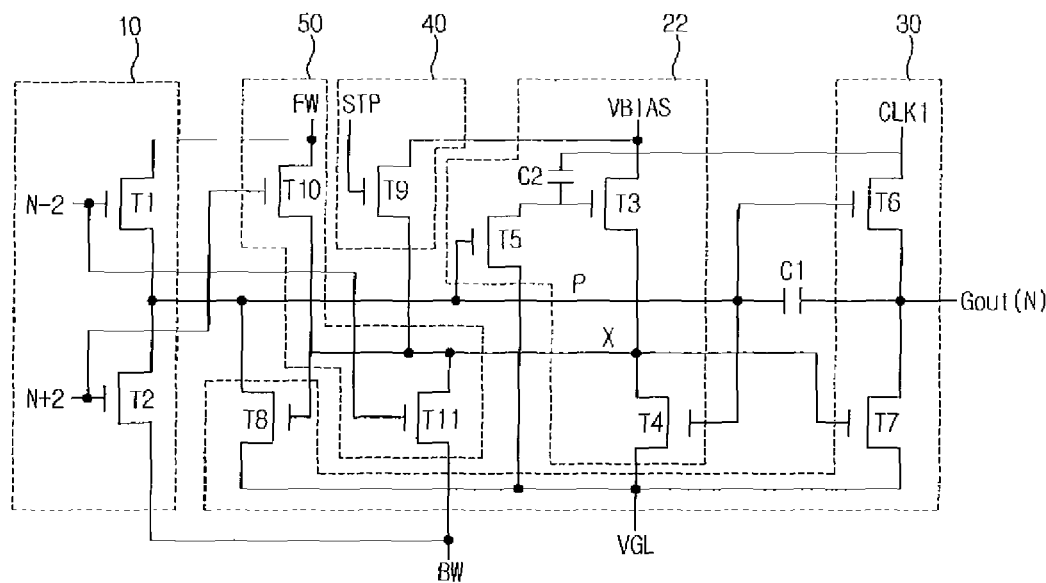
FIG. 16 is a detailed circuit diagram of a shift register according to a fifth exemplary embodiment of the invention.

FIG. 16 is a detailed circuit diagram of a shift register according to a fifth exemplary embodiment of the invention.

The fifth exemplary embodiment is different from the fourth exemplary embodiment in further including the stabilizer 40 for raising up the voltage at the X node by the gate start pulse (STP).

The stabilizer 40 is to close off the probability of abnormal driving at the first frame, detailed descriptions of which will be avoided since it was already described in the third exemplary embodiment.

Sixth Exemplary Embodiment

Figure 17:
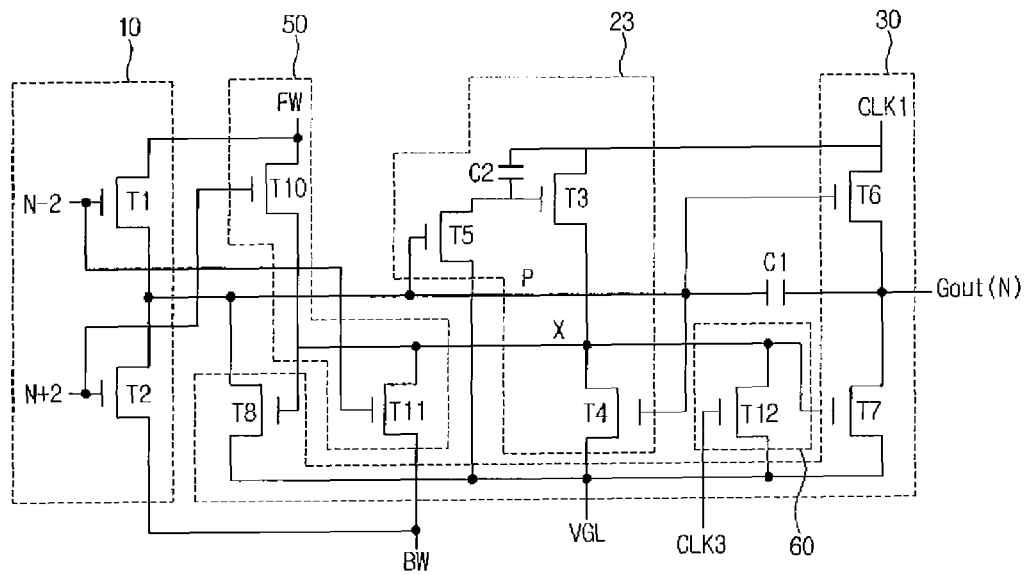
FIG. 17 is a detailed circuit diagram of a shift register according to a sixth exemplary embodiment of the invention.

FIG. 17 is a detailed circuit diagram of a shift register according to a sixth exemplary embodiment of the invention.

An inverter unit 23 according to the sixth exemplary embodiment is controlled by the same clock signal as the output clock signal differently from the inverter units 20 and 21 of the first to third exemplary embodiments, and receives the clock signal through the drain of the device T3 differently from the inverter units 21 and 22 of the second to fifth exemplary embodiments. Like this, the inverter unit in this exemplary embodiment may be configured so that the device T3 can be controlled by the same clock signal as or the clock signal different by 2 H from the output clock signal. Also, the signal input to the drain terminal of the device T3 may be a control clock signal for controlling the inverter unit or a separate bias voltage signal. Accordingly, the inverter unit in this exemplary embodiment may be freely configured by any combination as desired by those skilled in the art.

Like the fourth exemplary embodiment, the sixth exemplary embodiment uses one clock signal to control the output and the inverter unit, and therefore the reset auxiliary unit 50 may be further provided to immediately raise up the voltage at the X node when receiving the reset signal.

Also, the sixth exemplary embodiment further includes a swing unit 60 for periodically dropping the voltage at the X node by the swing clock signal CLK3.

As shown in FIG. 17, the swing unit 60 may be configured to include a switching device T12 that has a gate terminal to receive a swing clock signal CLK3, a drain terminal connected to the X node, and a source terminal connected to a base voltage terminal.

The swing unit 60 periodically drops the voltage at the X node increased by the clock signal CLK1, thereby minimizing the deterioration of the devices T2 and T4 due to the voltage at the X node. Therefore, a swing clock signal may be applied in the same cycle as the output clock signal, leaving a time difference.

In the case where the shift register in this exemplary embodiment additionally includes the swing unit 60, the control clock signal and the output clock signal may be configured with the same clock signal as shown in the sixth exemplary embodiment so as to prevent abnormal output of the shift register. Therefore, the control clock signal and the output clock signal may be configured with the same clock signal CLK3 or CLK1, and the swing clock signal may be configured with the clock signal CLK1 or CLK3 different from the control and output clock signals.

Figure 18:
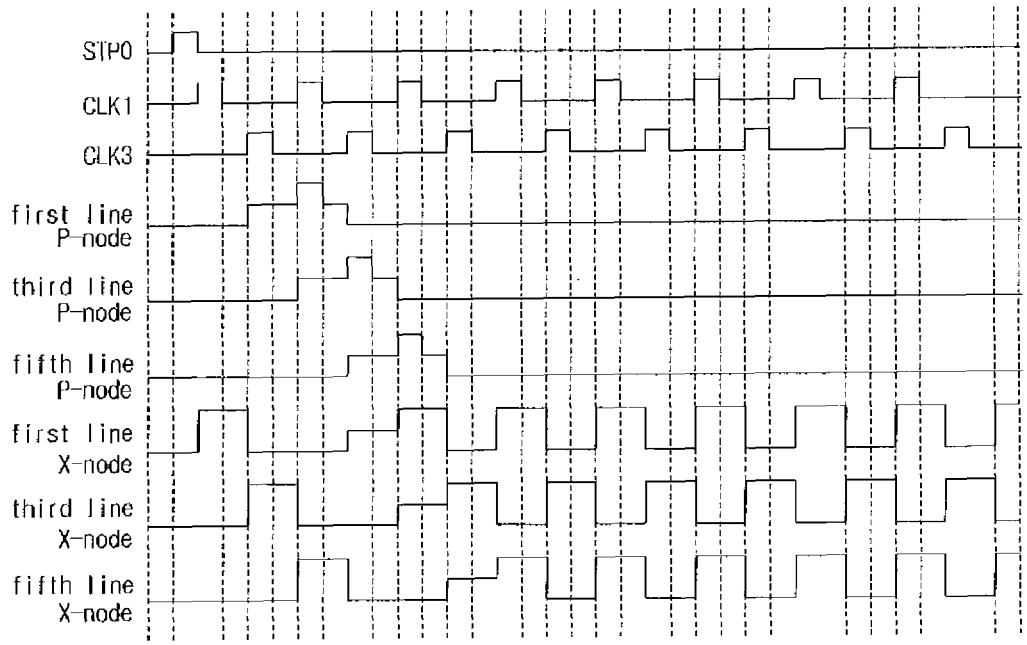
FIG. 18 is a timing diagram at a P node and an X node in a shift register provided with a swing unit according to a exemplary embodiment of the invention.

The timing diagrams at the X and P node with the swing unit 60 are shown in FIG. 18. As shown in FIG. 18, the voltage at the X node is periodically dropped by the swing unit 60 in a reset section, and is raised up to prevent abnormal output when receiving the output clock signal. Like this, the voltage at the X node alternates between increasing and decreasing.

Seventh Exemplary Embodiment

Figure 19:
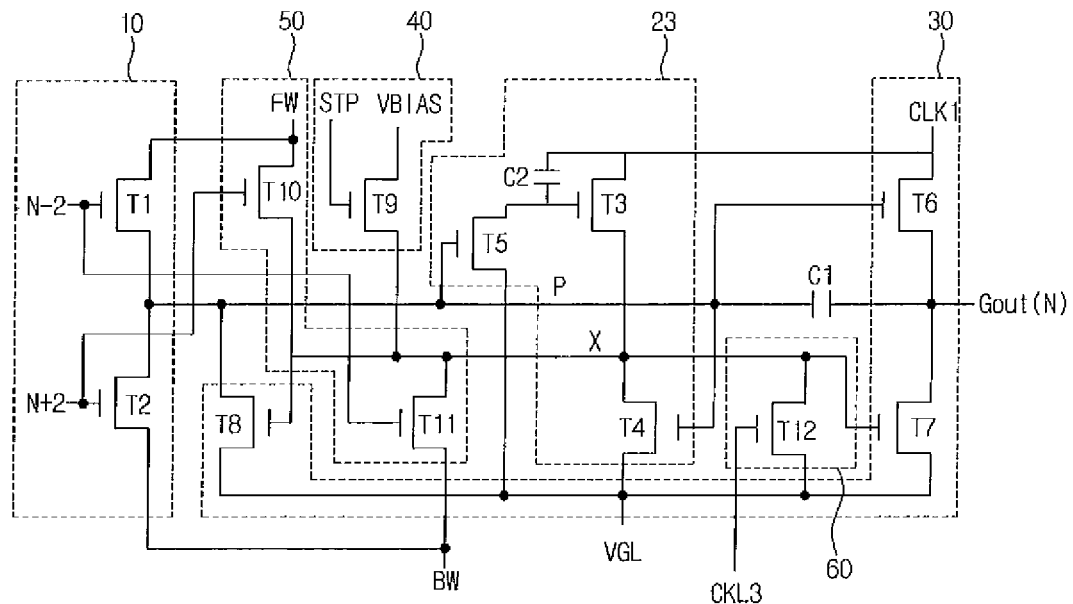
FIG. 19 is a detailed circuit diagram of a shift register according to a seventh exemplary embodiment of the invention.

FIG. 19 is a detailed circuit diagram of a shift register according to a seventh exemplary embodiment of the invention.

The seventh exemplary embodiment further includes the stabilizer 40 in addition to the sixth exemplary embodiment. Like the inverter units 20 and 23 of the first and sixth exemplary embodiments, if the bias voltage is not used as the input voltage for the drain terminal of the device T3, the bias voltage is connected only to the drain terminal of the device T9 as shown in the seventh exemplary embodiment, thereby configuring the shift register to have the stabilizer 40.

Figure 20:
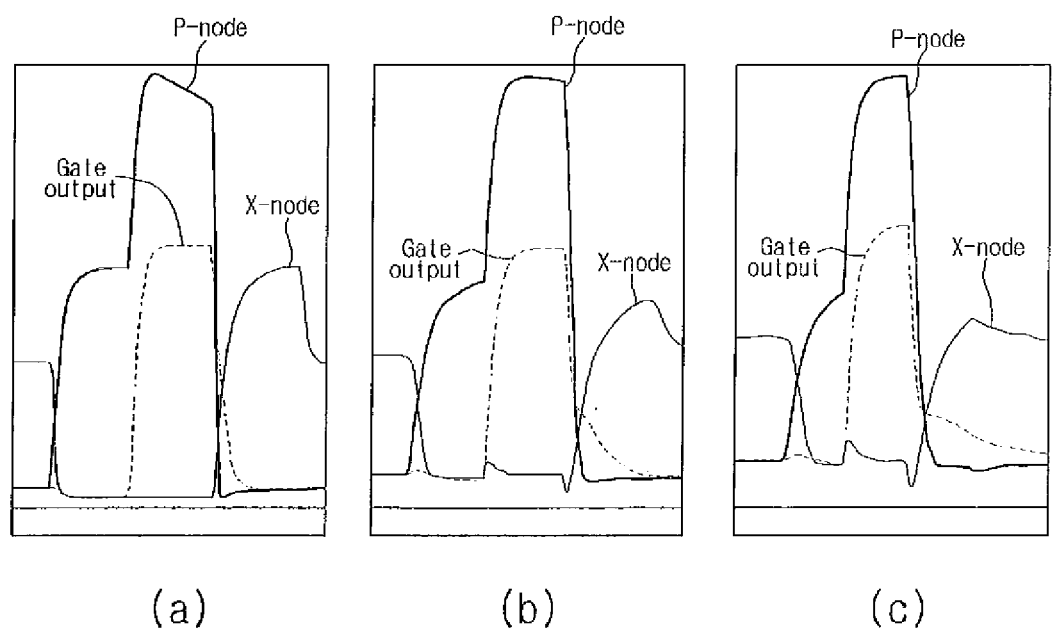
FIG. 20 is a graph showing simulation results with regard to the P node, the X node and output waveforms of a single type gate driving circuit employing the shift register according to an exemplary embodiment of the invention.
Figure 21:
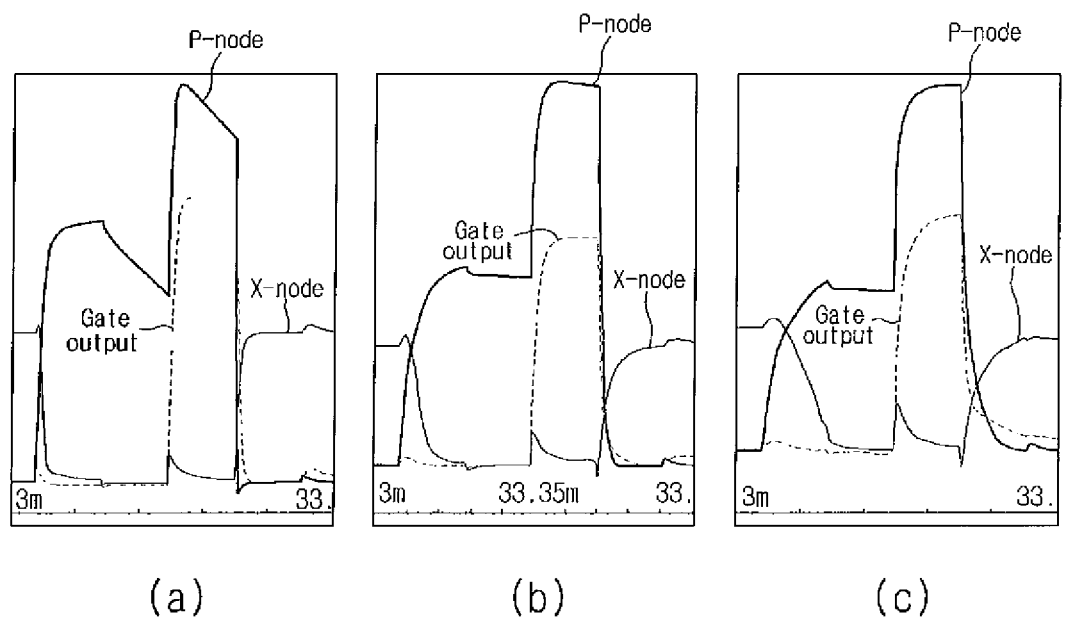
FIG. 21 is a graph showing simulation results with regard to the P node, the X node and output waveforms of a dual type gate driving circuit employing the shift register according to an exemplary embodiment of the invention.

FIG. 20 is a graph showing simulation results with regard to the P node, the X node and output waveforms of a single type gate driving circuit employing the shift register according to an exemplary embodiment of the invention. FIG. 21 is a graph showing simulation results with regard to the P node, the X node and output waveforms of a dual type gate driving circuit employing the shift register according to an exemplary embodiment of the invention.

In FIG. 20, (a) shows a spice simulation result of the single type gate driving circuit at a high temperature of about 60 degrees and a humidity of 90%, (b) shows a spice simulation result of the single type gate driving circuit at room temperature (e.g., about 25 to 27 degrees), and (c) shows a spice simulation result of the single type gate driving circuit at a low temperature of about −20 degrees.

In FIG. 21, (a) shows a spice simulation result of the dual type gate driving circuit at a high temperature of about 60 degrees and a humidity of 90%, (b) shows a spice simulation result of the dual type gate driving circuit at room temperature (e.g., about 25 to 27 degrees), and (c) shows a spice simulation result of the dual type gate driving circuit at a low temperature of about −20 degrees.

Referring to FIGS. 20 and 21, signal waveforms at the P and X nodes are normal in each case, and a gate output waveform is also stable.

Although the foregoing first to seventh exemplary embodiments are described with reference to the drawings that show the shift register used in one-side gate driving circuit for driving the odd lines when the gate driving circuit is dual type, it will be appreciated by those skilled in the art that the above shift register may be used for the gate driving circuit for driving the even lines and the single type gate driving circuit.

Also, it will be appreciated by those skilled in the art that the clock signals CLK2 and CLK4 applied once per 4 H period and having a difference of 2H may be used as the control, output and swing clock signals used in the first to seventh exemplary embodiments. Further, it will be appreciated by those skilled in the art that the clock signals CLK and CLKB having a phase difference of 180 degrees may be used in the case of the single type.

The shift register according to an exemplary embodiment is disclosed in the first to seventh exemplary embodiment, but not limited thereto. Alternatively, the shift register may be configured by variously combining four inverter units 20, 21, 22 and 23, the stabilizer 40, the reset auxiliary unit 50 and the swing unit 60 in addition to the input unit 10 and the output unit 30.

According to an exemplary embodiment, there is an effect of making not only bidirectional driving but also resetting possible by changing a signal connection state of an input unit without the conventional scan direction adjuster. Also, there is an effect of perfect inverting by coupling an inverter unit with a clock signal.

Further, there is an effect of minimizing the number of TFTs and signals needed for driving, minimizing deterioration of a TFT, and providing a shift register stabilized at initial driving.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A gate driving circuit comprising a plurality of shift registers connected in sequence to respectively supply scan signals to a plurality of gate lines of a display device, the shift register comprising:
an input unit which outputs a directional input signal having a gate high voltage VGH or a gate low voltage VGL based on an output signal from a previous or subsequent shift register of the shift register to a first node;
an inverter unit which is connected to the first node, generates an inverting signal to a signal at the first node, and outputs the inverting signal to a second node; and
an output unit which comprises a pull up unit connected to the first node and activating an output clock signal based on the signal at the first node to be output as an output signal to a corresponding gate line, and a pull-down unit activating and outputting a pull-down output signal based on a signal at the second node,
wherein the inverter unit is controlled by coupling with a control clock signal, wherein the inverter unit comprises:
a first switching device that comprises a gate terminal to receive the control clock signal through a capacitor, a drain terminal to receive the control clock signal, and a source terminal connected to the second node;

a second switching device that comprises a gate terminal connected to the first node, a drain terminal connected to the second node, and a source terminal connected to a base voltage terminal; and a third switching device that comprises a gate terminal connected to the first node, a drain terminal connected to the gate of the first switching device, and a source terminal connected to the base voltage terminal.

2. A gate driving circuit comprising a plurality of shift registers connected in sequence to respectively supply scan signals to a plurality of gate lines of a display device, the shift register comprising:

an input unit which outputs a directional input signal having a gate high voltage VGH or a gate low voltage VGL based on an output signal from a previous or subsequent shift register of the shift register to a first node;

an inverter unit which is connected to the first node, generates an inverting signal to a signal at the first node, and outputs the inverting signal to a second node; and an output unit which comprises a pull-up unit connected to the first node and activating an output clock signal based on the signal at the first node to be output as an output signal to a corresponding gate line, and a pull-down unit activating and outputting a pull-down output signal based on a signal at the second node, wherein the inverter unit is controlled by coupling with a control clock signal, wherein the inverter unit comprises:

a first switching device that comprises a gate terminal to receive the control clock signal through a capacitor, a drain terminal to receive a bias voltage signal, and a source terminal connected to the second node;

a second switching device that comprises a gate terminal connected to the first node, a drain terminal connected to the second node, and a source terminal connected to a base voltage terminal; and a third switching device that comprises a gate terminal connected to the first node, a drain terminal connected to the gate of the first switching device, and a source terminal connected to the base voltage terminal.

3. The gate driving circuit according to claim 1, wherein if the gate driving circuit is a single type, the output clock signal and the control clock signal are clock signals having a phase difference of 180 degrees, if the gate driving circuit is a dual type, the output clock signal and the control clock signals are applied once per 4H period and having a difference of 2H, and an output clock signal of an odd-ordered shift register and a control clock signal of an even-ordered shift register are the same clock signal, and a control clock signal of the odd-ordered shift register and an output clock signal of an even-ordered shift register are the same clock signal.

4. The gate driving circuit according to claim 1, wherein the control clock signal and the output clock signal are the same signal, if the gate driving circuit is a single type, the control and output clock signals of an odd-ordered shift register have a phase difference of 180 degrees from the control and output clock signals of an even-ordered shift register, and if the gate driving circuit is a dual type, the control and output clock signals of an odd-ordered shift register and the control and output clock signals of an even-ordered shift register are applied once per 4H period and have a difference of 2H.

5. The gate driving circuit according to claim 1, further comprising a stabilizer for increasing a voltage at the second node by a gate start pulse.

6. The gate driving circuit according to claim 5, wherein the stabilizer comprises a switching device that comprises a gate terminal to receive the gate start pulse, a drain terminal to receive a bias voltage signal, and a source terminal connected to the second node.

7. The gate driving circuit according to claim 4, further comprising a reset auxiliary unit that increases a voltage at the second node when a directional input signal having a gate low voltage VGL based on the output signal from the previous or subsequent shift register is input to the first node.

8. The gate driving circuit according to claim 7, wherein the reset auxiliary unit comprises a first switching device that comprises a gate terminal to receive the output signal from the subsequent shift register, a drain terminal to receive the directional input signal having a gate high voltage VGH or a gate low voltage VGL, and a source terminal connected to the second node; and a second switching device that comprises a gate terminal to receive the output signal from the previous shift register, a drain terminal to receive the directional input signal having a gate low voltage VGL or a gate high voltage VGH on the contrary to the first switching device, and a source terminal connected to the second node.

9. The gate driving circuit according to claim 4, further comprising a swing unit for periodically dropping a voltage at the second node in response to a swing clock signal.

10. The gate driving circuit according to claim 9, wherein the swing clock signal is a clock signal having a phase difference of 180 degrees from the control and output clock signals if the gate driving circuit is a single type, and is a clock signal having a difference of 2H from the control and output clock signals if the gate driving circuit is a dual type.

11. The gate driving circuit according to claim 9, wherein the swing unit comprises a switching device that comprises a gate terminal to receive the swing clock signal, a drain terminal connected to the second node, and a source terminal connected to the base voltage terminal.

12. The gate driving circuit according to claim 1, wherein among the plurality of shift registers, the output signal from the previous shift register of the first shift register and the output signal from the subsequent shift register of the last shift register are gate start pulses.

13. The gate driving circuit according to claim 1, wherein the input unit comprises a first switching device that comprises a gate terminal to receive an output signal from the previous shift register, a drain terminal to receive the directional input signal having the gate high voltage VGH or the gate low voltage VGL, and a source terminal connected to the first node; and a second switching device that comprises a gate terminal to receive an output signal from the subsequent shift register, a drain terminal to receive the directional input signal having the gate low voltage VGL or the gate high voltage VGH as opposed to the first switching device, and a source terminal connected to the first node.

14. The gate driving circuit according to claim 13, wherein in the case of forward driving where the directional input signal having the gate high voltage VGH is input to the first switching device based on the output signal of the previous shift register, the second switching device receives the directional input signal having the gate low voltage VGL based on the output signal from the subsequent shift register, and the first node is reset by the directional input signal having the gate low voltage VGL.

15. The gate driving circuit according to claim 13, wherein in the case of backward driving where the directional input signal having the gate high voltage VGH is input to the second switching device based on the output signal of the subsequent shift register, the first switching device receives the directional input signal having the gate low voltage VGL based on the output signal from the previous shift register, and the first node is reset by the directional input signal having the gate low voltage VGL.

16. A shift register comprising:
   a first switching device T1 that comprises a gate terminal connected to an output terminal of a previous shift register, a drain terminal to receive a directional input signal having a gate high voltage or a gate low voltage, and a source terminal connected to a first node;
   a second switching device T2 that comprises a gate terminal connected to an output terminal of a subsequent shift register, a drain terminal to receive a directional input signal having a gate low voltage or a gate high voltage as opposed to the first switching device, and a source terminal connected to the first node;
   a third switching device T3 that comprises a gate terminal to receive a control clock signal through a capacitor, a drain terminal to receive the control clock signal, and a source terminal connected to a second node;
   a fourth switching device T4 that comprises a gate terminal connected to the first node, a drain terminal connected to the second node, and a source terminal connected to a base voltage terminal;
   a fifth switching device T5 that comprises a gate terminal connected to the first node, a drain terminal connected to the gate of the third switching device, and a source terminal connected to the base voltage terminal;
   a sixth switching device T6 that comprises a gate terminal connected to the first node, a drain terminal to receive an output clock signal, and a source terminal connected to an output terminal;
   a seventh switching device T7 that comprises a gate terminal connected to the second node, a drain terminal connected to the output terminal, and a source terminal connected to the base voltage terminal; and
   an eighth switching device T8 that comprises a gate terminal connected to the second node, a drain terminal connected to the first node, and a source terminal connected to the base voltage terminal, wherein the control clock signal and the output clock signal are the same clock signal.

17. The shift register according to claim 16, further comprising:
   a tenth switching device T10 that comprises a gate terminal to receive an output signal from the subsequent shift register, a drain terminal to receive the same directional input signal as the first switching device, and a source terminal connected to the second node; and
   an eleventh switching device T11 that comprises a gate terminal to receive an output signal from the previous shift register, a drain terminal to receive the same directional input signal as the second switching device, and a source terminal connected to the second node.

18. The shift register according to claim 16, further comprising a twelfth switching device T12 that comprises a gate terminal to receive a swing clock signal, a drain terminal connected to the second node, and a source terminal connected to a base voltage terminal.

19. The shift register according to claim 18, wherein the swing clock signal is applied in the same cycle as the control and output clock signals, leaving a time difference.

20. The shift register according to claim 18, further comprising a ninth switching device T9 that comprises a gate terminal to receive a gate start pulse, a drain terminal to receive a bias voltage signal, and a source terminal connected to the second node.

21. A shift register comprising:
   a first switching device T1 that comprises a gate terminal connected to an output terminal of a previous shift register, a drain terminal to receive a directional input signal having a gate high voltage or a gate low voltage, and a source terminal connected to a first node;
   a second switching device T2 that comprises a gate terminal connected to an output terminal of a subsequent shift register, a drain terminal to receive a directional input signal having a gate low voltage or a gate high voltage as opposed to the first switching device, and a source terminal connected to the first node;
   a third switching device T3 that comprises a gate terminal to receive a control clock signal through a capacitor, a drain terminal to receive a bias voltage, and a source terminal connected to a second node;
   a fourth switching device T4 that comprises a gate terminal connected to the first node, a drain terminal connected to the second node, and a source terminal connected to a base voltage terminal;
   a fifth switching device T5 that comprises a gate terminal connected to the first node, a drain terminal connected to the gate of the third switching device, and a source terminal connected to the base voltage terminal;
   a sixth switching device T6 that comprises a gate terminal connected to the first node, a drain terminal to receive an output clock signal, and a source terminal connected to an output terminal;
   a seventh switching device T7 that comprises a gate terminal connected to the second node, a drain terminal connected to the output terminal, and a source terminal connected to the base voltage terminal; and
   an eighth switching device T8 that comprises a gate terminal connected to the second node, a drain terminal connected to the first node, and a source terminal connected to the base voltage terminal.

22. The shift register according to claim 21, further comprising a ninth switching device T9 that comprises a gate terminal to receive a gate start pulse, a drain terminal to receive the bias voltage signal, and a source terminal connected to the second node.

23. The shift register according to claim 21, wherein the control clock signal and the output clock signal are the same clock signal.

24. The shift register according to claim 23, further comprising:
   a tenth switching device T10 that comprises a gate terminal to receive an output signal from the subsequent shift register, a drain terminal to receive the same directional input signal as the first switching device, and a source terminal connected to the second node; and
   an eleventh switching device T11 that comprises a gate terminal to receive an output signal from the previous shift register, a drain terminal to receive the same directional input signal as the second switching device, and a source terminal connected to the second node.

25. The gate driving circuit according to claim 2, wherein
if the gate driving circuit is a single type, the output clock signal and the control clock signal are clock signals having a phase difference of 180 degrees,
if the gate driving circuit is a dual type, the output clock signal and the control clock signals are applied once per 4H period and having a difference of 2H, and
an output clock signal of an odd-ordered shift register and a control clock signal of an even-ordered shift register are the same clock signal, and a control clock signal of the odd-ordered shift register and an output clock signal of an even-ordered shift register are the same clock signal.

26. The gate driving circuit according to claim 2, wherein the control clock signal and the output clock signal are the same signal,
if the gate driving circuit is a single type, the control and output clock signals of an odd-ordered shift register have a phase difference of 180 degrees from the control and output clock signals of an even-ordered shift register, and
if the gate driving circuit is a dual type, the control and output clock signals of an odd-ordered shift register and the control and output clock signals of an even-ordered shift register are applied once per 4H period and have a difference of 2H.

27. The gate driving circuit according to claim 2, further comprising a stabilizer for increasing a voltage at the second node by a gate start pulse.

28. The gate driving circuit according to claim 27, wherein the stabilizer comprises a switching device that comprises a gate terminal to receive the gate start pulse, a drain terminal to receive a bias voltage signal, and a source terminal connected to the second node.

29. The gate driving circuit according to claim 26, further comprising a reset auxiliary unit that increases a voltage at the second node when a directional input signal having a gate low voltage VGL based on the output signal from the previous or subsequent shift register is input to the first node.

30. The gate driving circuit according to claim 29, wherein the reset auxiliary unit comprises
a first switching device that comprises a gate terminal to receive the output signal from the subsequent shift register, a drain terminal to receive the directional input signal having a gate high voltage VGH or a gate low voltage VGL, and a source terminal connected to the second node; and
a second switching device that comprises a gate terminal to receive the output signal from the previous shift register, a drain terminal to receive the directional input signal having a gate low voltage VGL or a gate high voltage VGH on the contrary to the first switching device, and a source terminal connected to the second node.

31. The gate driving circuit according to claim 26, further comprising a swing unit for periodically dropping a voltage at the second node in response to a swing clock signal.

32. The gate driving circuit according to claim 31, wherein the swing clock signal is a clock signal having a phase difference of 180 degrees from the control and output clock signals if the gate driving circuit is a single type, and is a clock signal having a difference of 2H from the control and output clock signals if the gate driving circuit is a dual type.

33. The gate driving circuit according to claim 31, wherein the swing unit comprises a switching device that comprises a gate terminal to receive the swing clock signal, a drain terminal connected to the second node, and a source terminal connected to the base voltage terminal.

34. The gate driving circuit according to claim 2, wherein among the plurality of shift registers, the output signal from the previous shift register of the first shift register and the output signal from the subsequent shift register of the last shift register are gate start pulses.

35. The gate driving circuit according to claim 2, wherein the input unit comprises
a first switching device that comprises a gate terminal to receive an output signal from the previous shift register, a drain terminal to receive the directional input signal having the gate high voltage VGH or the gate low voltage VGL, and a source terminal connected to the first node; and
a second switching device that comprises a gate terminal to receive an output signal from the subsequent shift register, a drain terminal to receive the directional input signal having the gate low voltage VGL or the gate high voltage VGH as opposed to the first switching device, and a source terminal connected to the first node.

36. The gate driving circuit according to claim 35, wherein in the case of forward driving where the directional input signal having the gate high voltage VGH is input to the first switching device based on the output signal of the previous shift register, the second switching device receives the directional input signal having the gate low voltage VGL based on the output signal from the subsequent shift register, and the first node is reset by the directional input signal having the gate low voltage VGL.

37. The gate driving circuit according to claim 35, wherein in the case of backward driving where the directional input signal having the gate high voltage VGH is input to the second switching device based on the output signal of the subsequent shift register, the first switching device receives the directional input signal having the gate low voltage VGL based on the output signal from the previous shift register, and the first node is reset by the directional input signal having the gate low voltage VGL.

* * * * *